United States Patent
Chang et al.

(10) Patent No.: US 9,802,816 B2
(45) Date of Patent: Oct. 31, 2017

(54) MEMS DEVICE STRUCTURE AND METHODS OF FORMING SAME

(71) Applicant: Taiwan Semiconductor Manufacturing Company, Ltd., Hsin-Chu (TW)

(72) Inventors: Chang-Chia Chang, Hsin-Chu (TW); Chen-Chih Fan, Zhubei (TW); Bruce C. S. Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 109 days.

(21) Appl. No.: 14/860,505

(22) Filed: Sep. 21, 2015

(65) Prior Publication Data

US 2016/0009551 A1    Jan. 14, 2016

Related U.S. Application Data

(62) Division of application No. 13/450,223, filed on Apr. 18, 2012, now Pat. No. 9,139,420.

(51) Int. Cl.
| | |
|---|---|
| *B81B 7/00* | (2006.01) |
| *B81C 1/00* | (2006.01) |
| *H01L 29/84* | (2006.01) |
| *B81B 3/00* | (2006.01) |

(52) U.S. Cl.
CPC ............ *B81C 1/00269* (2013.01); *B81B 7/00* (2013.01); *B81B 7/0041* (2013.01); *B81B 7/0051* (2013.01); *B81C 1/00* (2013.01); *B81C 1/00325* (2013.01); *B81B 3/007* (2013.01); *B81B 3/0018* (2013.01); *B81B 3/0067* (2013.01); *B81B 7/0006* (2013.01); *B81B 7/0016* (2013.01); *B81B 7/0029* (2013.01); *B81B 7/0058* (2013.01); *B81B 2201/025* (2013.01); *B81B 2201/0228* (2013.01); *B81B 2201/0235* (2013.01); *B81B 2207/07* (2013.01); *B81B 2207/096* (2013.01); *B81C 1/00293* (2013.01); *B81C 2203/0118* (2013.01)

(58) Field of Classification Search
None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |

(Continued)

*Primary Examiner* — Daniel Whalen
(74) *Attorney, Agent, or Firm* — Slater Matsil, LLP

(57) ABSTRACT

A microelectromechanical system (MEMS) device may include a MEMS structure above a first substrate. The MEMS structure comprising a central static element, a movable element, and an outer static element. A portion of bonding material between the central static element and the first substrate. A second substrate above the MEMS structure, with a portion of a dielectric layer between the central static element and the second substrate. A supporting post comprises the portion of bonding material, the central static element, and the portion of dielectric material.

21 Claims, 15 Drawing Sheets

(56) References Cited

U.S. PATENT DOCUMENTS

| | | | |
|---|---|---|---|
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2009/0261430 A1 | 10/2009 | Suzuki et al. | |
| 2010/0006959 A1* | 1/2010 | Kim | B81C 1/00301 257/415 |
| 2010/0252898 A1* | 10/2010 | Tanaka | B81B 7/0041 257/415 |
| 2010/0270630 A1* | 10/2010 | Fujii | B81B 7/007 257/415 |
| 2011/0042761 A1* | 2/2011 | Karlin | B81C 1/00269 257/415 |

* cited by examiner

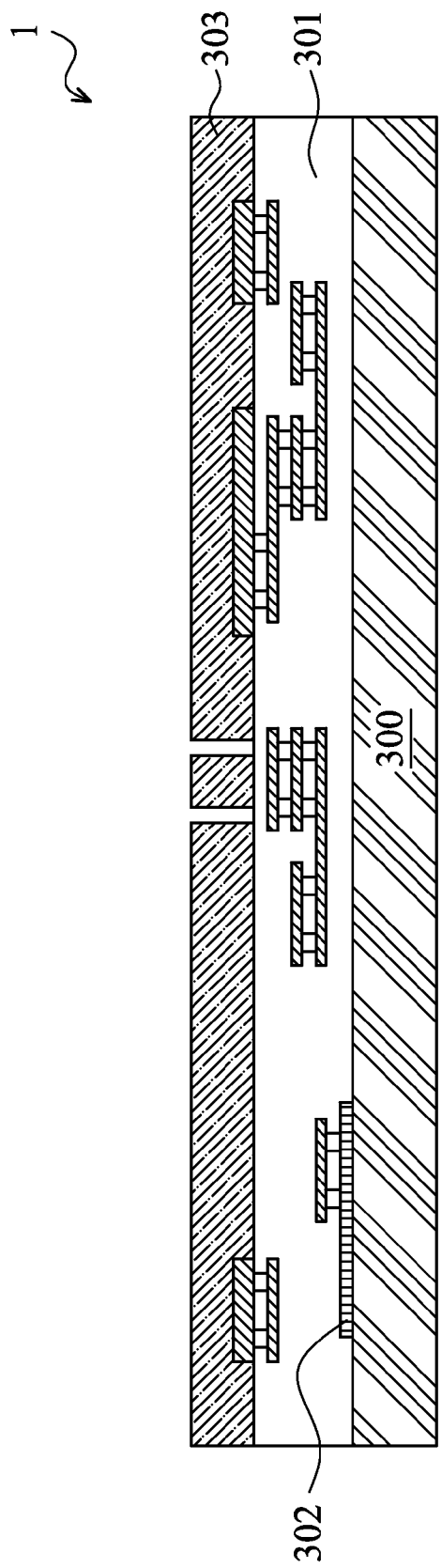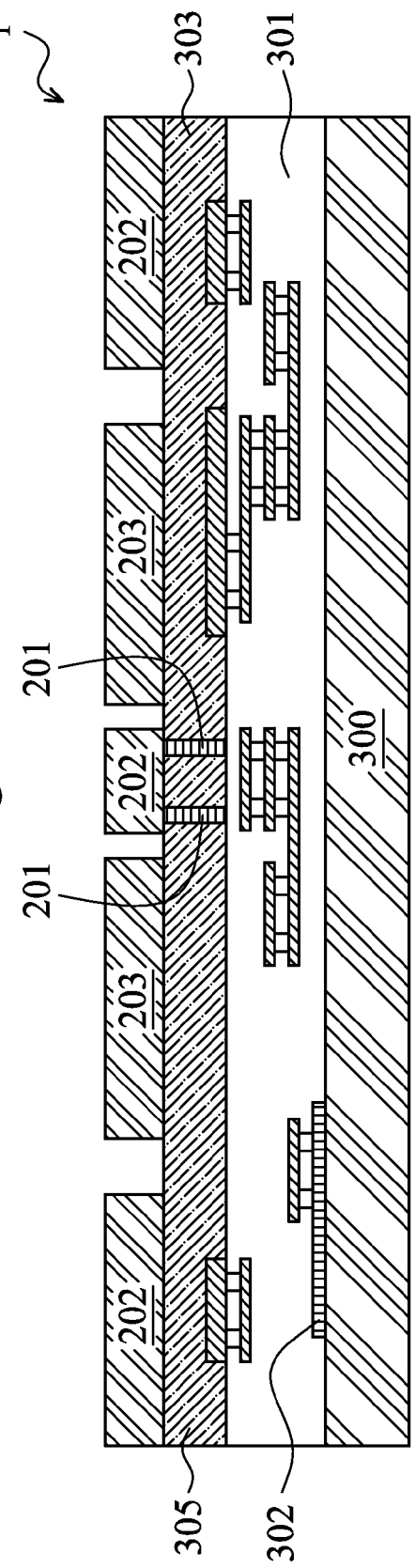

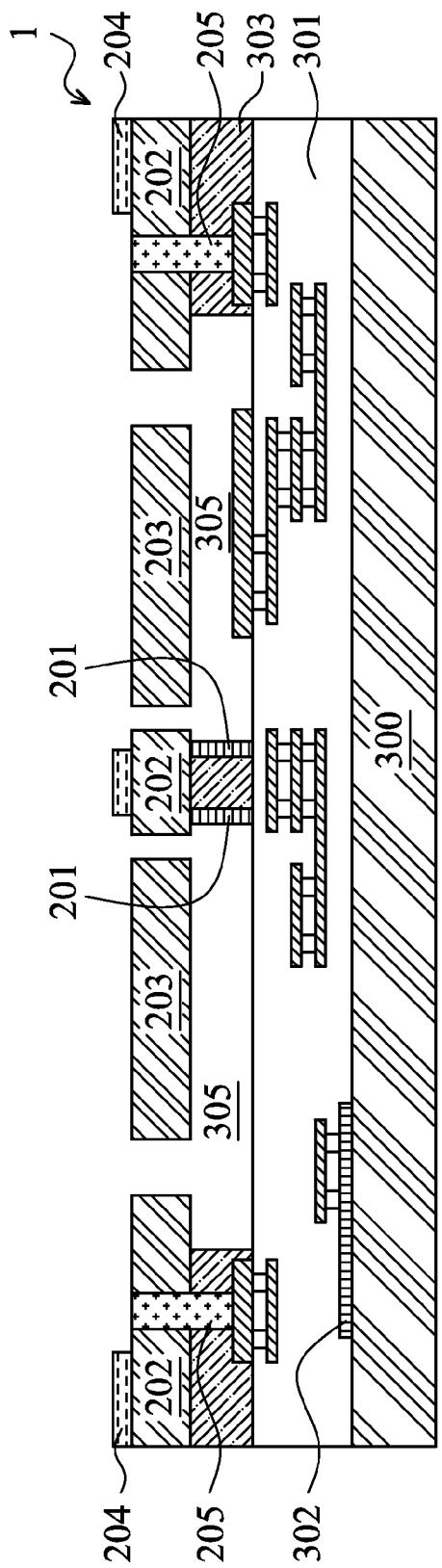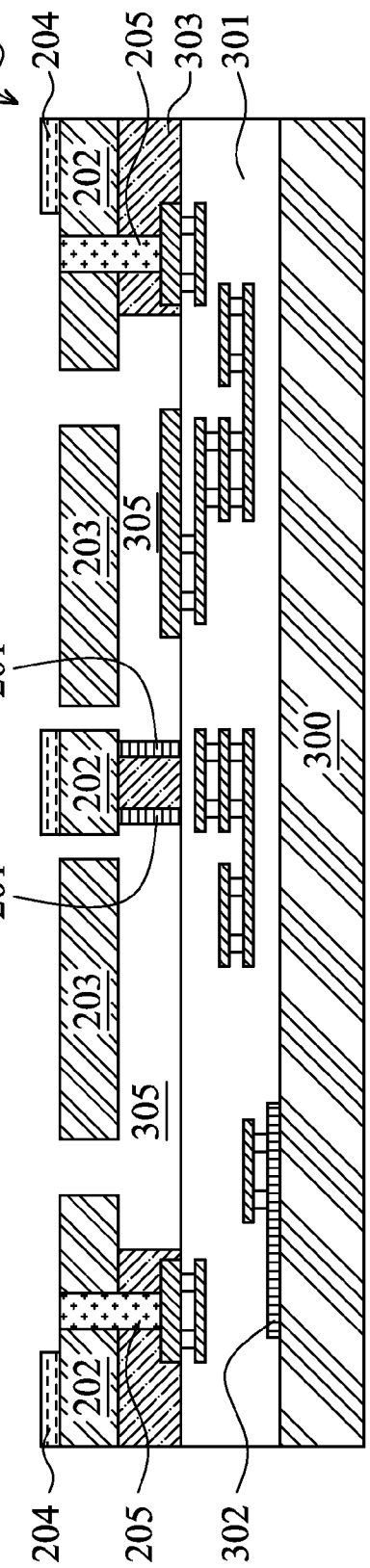
Figure 3d
Figure 3e

MEMS DEVICE STRUCTURE AND METHODS OF FORMING SAME

This application is a divisional of U.S. patent application Ser. No. 13/450,223, entitled "MEMS Device Structure and Methods of Forming Same," filed on Apr. 18, 2012, which application is hereby incorporated herein by reference.

BACKGROUND

Microelectromechanical systems (MEMS) are the technology of forming micro-structures with dimensions in the micrometer scale (one millionth of a meter). Significant parts of the technology have been adopted from integrated circuit (IC) technology. Most of the devices are built on silicon wafers and realized in thin films of materials. There are three basic building blocks in MEMS technology, which are the ability to deposit thin films of material on a substrate, to apply a patterned mask on top of the films by photolithographic imaging, and to etch the films selectively to the mask. A MEMS process is usually a structured sequence of these operations to form actual devices.

MEMS applications include inertial sensors applications, such as motion sensors, accelerometers, and gyroscopes. Other MEMS applications include optical applications such as movable mirrors, and RF applications such as RF switches and resonators.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3a through 3f illustrate steps in the manufacture of a second illustrative embodiment of a MEMS device;

DETAILED DESCRIPTION OF ILLUSTRATIVE EMBODIMENTS

Figure 1A:
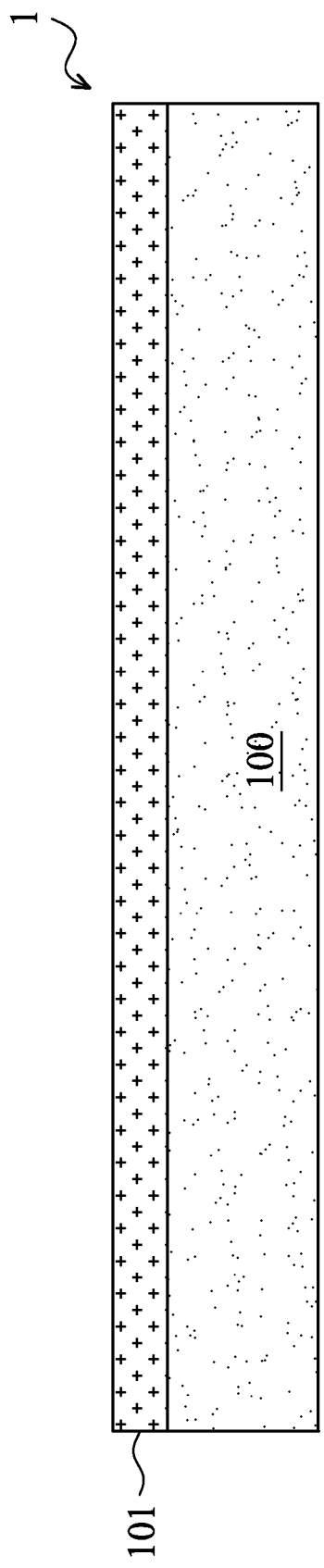
FIG. 1a through 1k illustrate steps in the manufacture of an illustrative embodiment of a MEMS device.

Various steps in the formation of a MEMS device will be described with reference to FIGS. 1a through 1k. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a MEMS motion sensor device with a supporting post structure. Other embodiments may also be applied, however, to other MEMS devices, such as accelerometers and gyroscopes.

With reference to FIG. 1a, there is shown a cross-sectional view of a MEMS device 1 at an intermediate stage of processing. The MEMS device 1 includes a dielectric layer 101 on a wafer 100. Wafer 100 may comprise a bulk silicon wafer. In other embodiments, wafer 100 may comprise any semiconductor substrate, ceramic substrate, quartz substrate, or the like. In some embodiments, wafer 100 comprises a silicon-on-insulator (SOI) or other composite wafer. Other substrates that may be used include multi-layered substrates, gradient substrates, or hybrid orientation substrates.

The wafer 100 may include active and passive devices (not shown in FIG. 1a). As one of ordinary skill in the art will recognize, a wide variety of active and passive devices such as transistors, capacitors, resistors, combinations of these, and the like may be used to generate the structural and functional requirements of the design for the MEMS device 1. The active and passive devices may be formed using any suitable methods.

The dielectric layer 101 is formed on the wafer 100. The dielectric layer 101 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, or a combination thereof. The dielectric layer 101 may be deposited through a process such as chemical vapor deposition (CVD), a spin-on-glass process, although any acceptable process may be utilized. It is in the dielectric layer 101 that an upper cavity 102 is formed (see FIG. 1f).

Figure 1B:
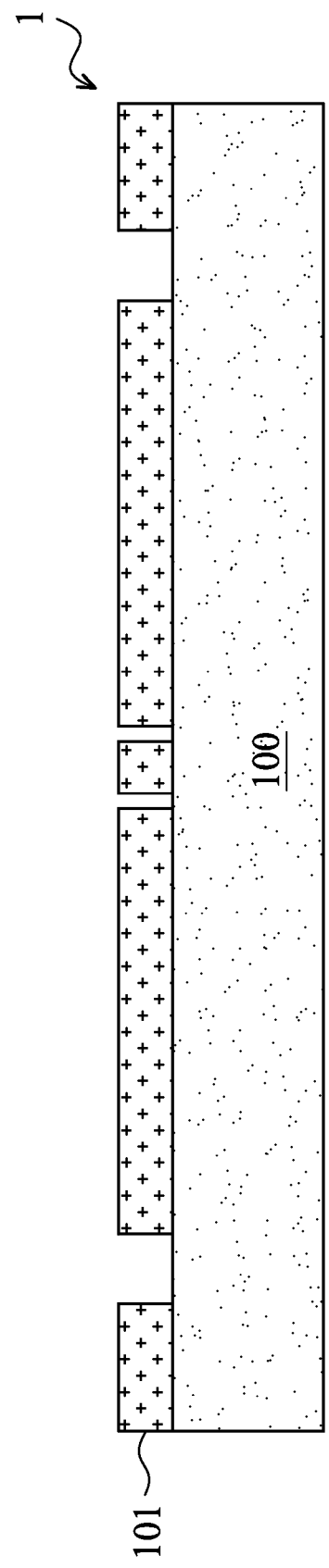

FIG. 1b illustrates the patterning of the dielectric layer 101 to form openings in the dielectric layer 101. The patterning process may be accomplished by depositing a commonly used mask material (not shown) such as photoresist or silicon oxide over the dielectric layer 101. The mask material is then patterned and the dielectric layer 101 is etched in accordance with the pattern.

Figure 1C:
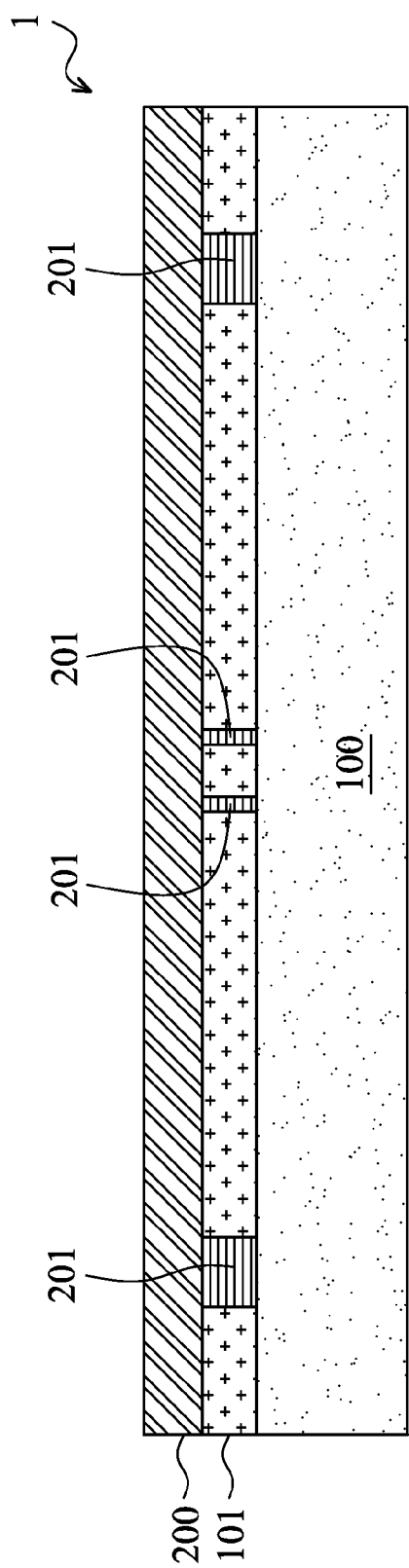

In FIG. 1c, a protective component 201 is deposited in the openings in the dielectric layer 101 and a wafer 200 is placed atop the dielectric layer 101 and the protective component 201. In an embodiment, the protective component 201 is deposited in the openings in the dielectric layer 101, the protective component 201 and the dielectric layer 101 may be planarized through a process such as chemical mechanical processing (CMP), and the wafer 200 may be placed on the top surfaces of the dielectric layer 101 and protective component 201. In this embodiment, the protective component 201 may comprise aluminum, copper, an aluminum copper alloy, a titanium tungsten alloy, polysilicon, or a combination thereof. The wafer 200 may comprise similar materials as the wafer 100, such as a bulk silicon wafer, any semiconductor substrate, ceramic substrate, quartz substrate, or the like, although wafer 100 and wafer 200 need not both be the same material. The wafer 200 and the dielectric layer 101 may be bonded by direct wafer bonding. The bonding process may be improved or expedited by the application of heat or pressure. In another embodiment, the wafer 200 may be epitaxially grown from a top surface of the dielectric layer 101 and the protective component 201. Because the process is known in the art, the details are not repeated herein. The wafer 200 may be doped either through an implantation process to introduce p-type or n-type impurities into the wafer 200, or else by in-situ doping as the material is grown. In yet another embodiment, the wafer 200 may be formed of semiconductor material and deposited on a top surface of the dielectric layer 101 and the protective component 201. The semiconductor material may comprise silicon, germanium, the like, or a combination thereof. The wafer 200 may be doped through an implantation method as discussed above.

Figure 1D:
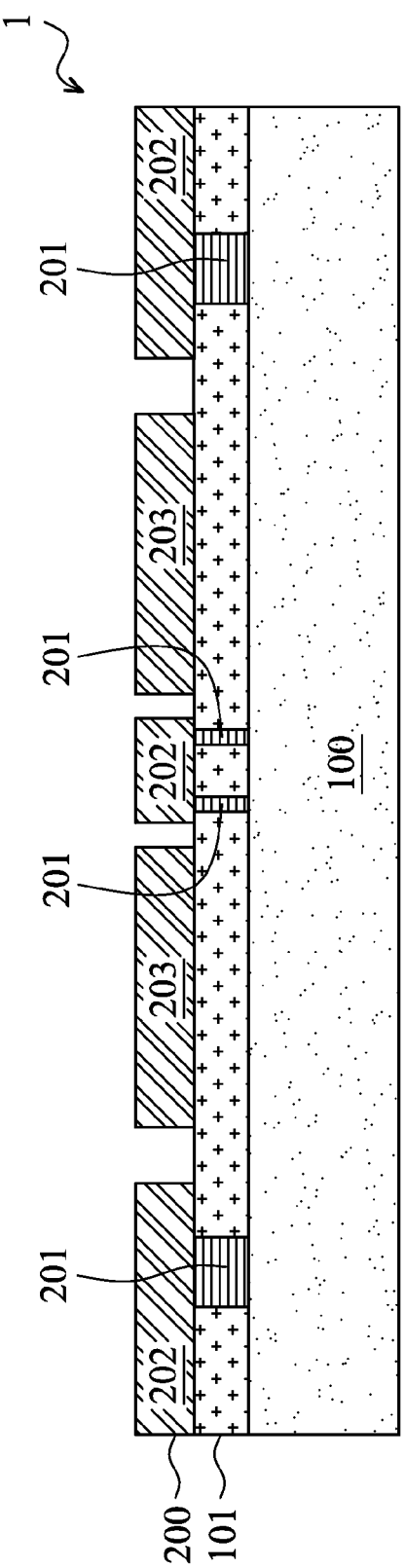

FIG. 1d illustrates the patterning of the wafer 200 into a movable element 203 and static elements 202. The patterning process may be accomplished by depositing a commonly used mask material (not shown) such as photoresist or silicon oxide over the wafer 100. The mask material is then patterned and the wafer 200 is etched in accordance with the pattern. The movable element 203 is not movable in FIG. 1d, as it is still on top of the dielectric layer 101.

Figure 1E:
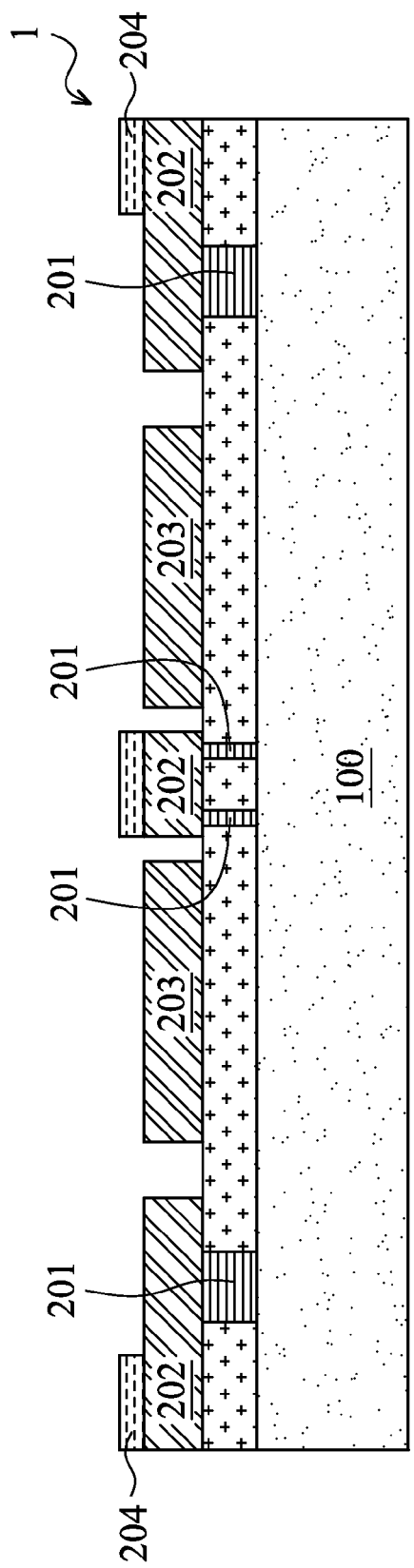

FIG. 1e illustrates the formation and patterning of bonding material 204 on the static elements 202 and the movable element 203. The bonding material 204 may be made of aluminum copper, germanium, gold, the like, or a combination thereof. The bonding material 204 may act as a eutectic bonding material for subsequent bonding processes. The bonding material 204 may be formed using physical vapor deposition (PVD), such as sputtering or evaporation, the like, a combination thereof, or other acceptable methods, and may be patterned using acceptable lithography techniques.

Figure 1F:
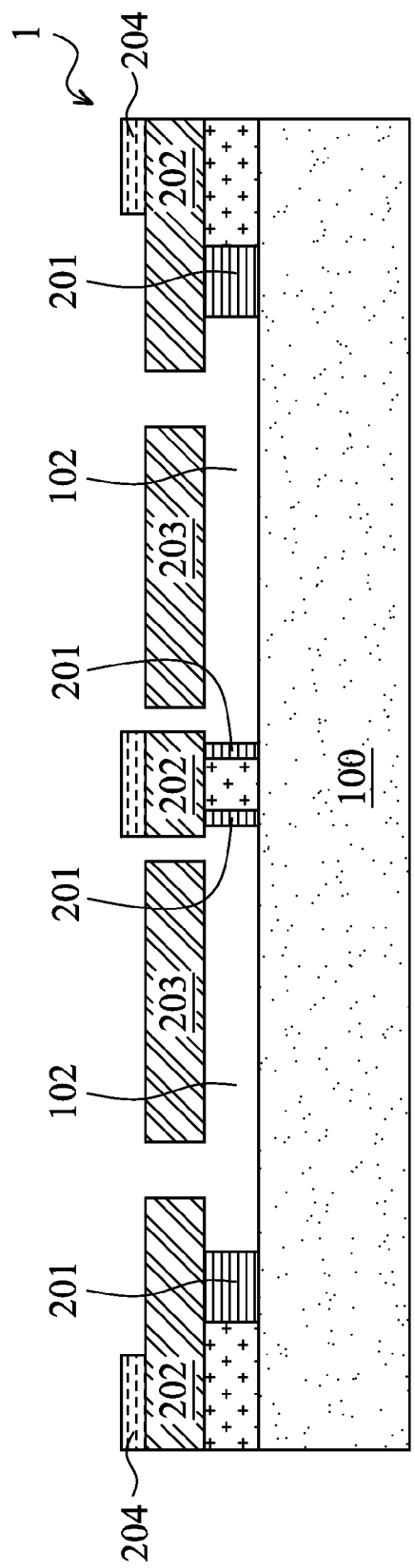

In FIG. 1f, the upper cavity 102 is formed by the removal of a portion of the dielectric layer 101. The resulting structure is a MEMS device 1 having a movable element 203 formed over an upper cavity 102 to allow for free movement in at least one axis. The movable element 203 may be supported by hinges, springs, beams, or the like (not shown) which extend from the static elements 202. In an embodiment, the portion of the dielectric layer 101 may be removed by an etch process. The etch process may be a diluted hydrofluoric acid (DHF) treatment or a vapor hydrofluoric acid (VHF) treatment for a suitable time. These type of etch processes have high selectivity between the dielectric layer 101, the wafer 200, and the wafer 100, so that the wafer 100 and the wafer 200 are not significantly attacked during the removal of the dielectric layer 101. Note further that the protective component 201 protects portions of the dielectric layer 101 under the static elements 202 during the wet etch process.

Figure 1G:
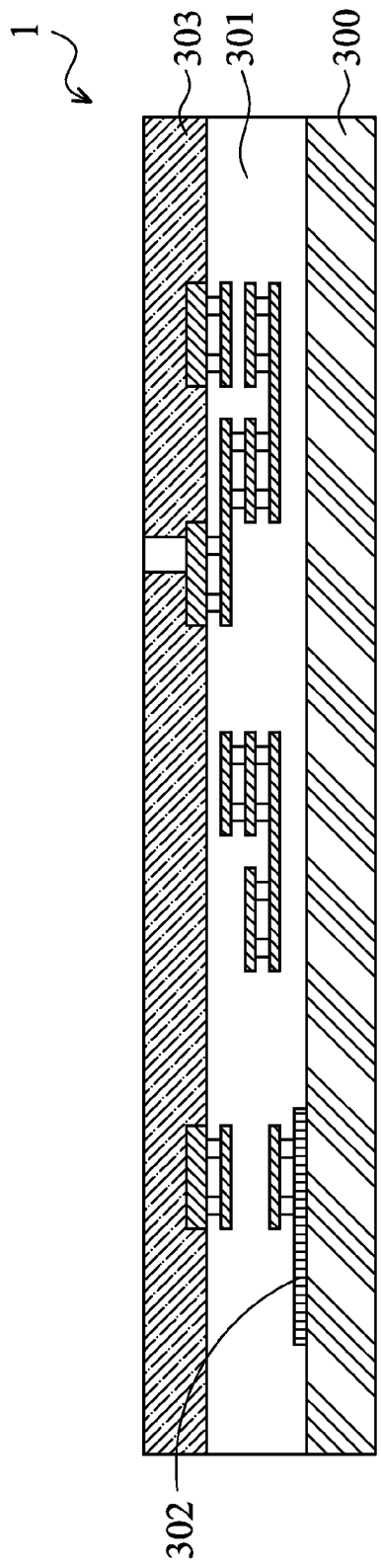

In FIG. 1g, a wafer 300 is illustrated at an intermediate stage of processing. The wafer 300 may comprise a contact pad 302, an interconnect structure 301 on the wafer 300, and a dielectric layer 303 on the interconnect structure 301. The wafer 300 may comprise similar materials as the wafers 100 and 200, such as a bulk silicon wafer, any semiconductor substrate, ceramic substrate, quartz substrate, or the like, but need not be the same material.

The wafer 300 may include active and passive devices (not shown in FIG. 1g). As one of ordinary skill in the art will recognize, a wide variety of active and passive devices such as transistors, capacitors, resistors, combinations of these, and the like may be used to generate the structural and functional requirements of the design for the MEMS device 1. The active and passive devices may be formed using any suitable methods.

The contact pad 302 may be formed on a top surface of wafer 300 and in electrical contact with the interconnect structure 301 in order to provide external connections to the active and passive devices, the movable element 203, and the static elements 202. The contact pad 302 may comprise aluminum, copper, the like, or a combination thereof. The contact pad 302 may be formed using a deposition process, such as sputtering, to form a layer of material (not shown) and portions of the layer of material may then be removed through a suitable process (such as photolithographic masking and etching) to form the contact pad 302. However, any other suitable process may be utilized to form the contact pad 302.

The interconnect structure 301 may be formed on the top surface of the wafer 300. The interconnect structure 301 may provide electrical and physical connections between and/or to the active and passive devices, the movable element 203, and the static elements 202 and external devices through the contact pads 403 and the through substrate via ("TSV") 400 (also known as a "through semiconductor via" or a "through silicon via") (see FIG. 1k). The interconnect structure 301 may comprise any number or combination of metallization layers, inter-metal dielectric (IMD) layers, vias, and passivation layers. The interconnect structure 301 depicted in FIG. 1g comprises three metallization layers in IMD layers (connections depicted in metallization layers in the figures not intended to implicate specific connections). Vias are formed between metallization layers in the IMD layers. The metallization layers are formed by depositing an IMD layer, etching the metallization pattern of the layer in the IMD layer using, for example, acceptable photolithography techniques, depositing a conductive material for the metallization in the IMD, and removing any excess conductive material by, for example, CMP. The photolithography technique may include a single damascene process or a dual damascene process, particularly when vias are formed through an IMD to an underlying metallization layer.

The IMD layers can be an oxide dielectric, such as a silicon dioxide ($SiO_2$), borophosphosilicate glass (BPSG), or other dielectric materials. The conductive material of the metallization layers may be, for example, copper, nickel, aluminum, copper aluminum, tungsten, titanium, gold, silver, combinations of these, such as alloys, or the like. The metallization layers may include barrier layers between the conductive material and the IMD material, and other dielectric layers, such as etch stop layers made of, for example, silicon nitride, may be formed between the IMD layers.

The dielectric layer 303 is formed on the interconnect structure 301. The dielectric layer 303 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, or a combination thereof. The dielectric layer 303 may be deposited through a process such as chemical vapor deposition (CVD), a spin-on-glass process, although any acceptable process may be utilized.

Figure 1H:
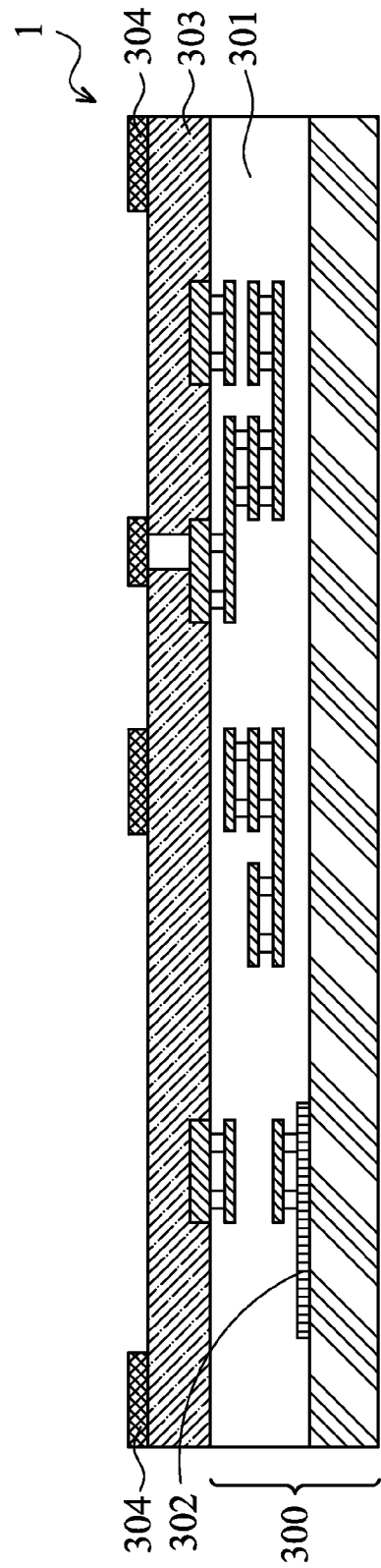

FIG. 1h illustrates the formation and patterning of bonding material 304 on the dielectric layer 303. The bonding material 304 may be made of aluminum copper, germanium, gold, the like, or a combination thereof. The bonding material 304 may be formed using PVD, such as sputtering or evaporation, the like, a combination thereof, or other acceptable methods. The bonding material 304 may be patterned using acceptable lithography techniques.

Figure 1I:
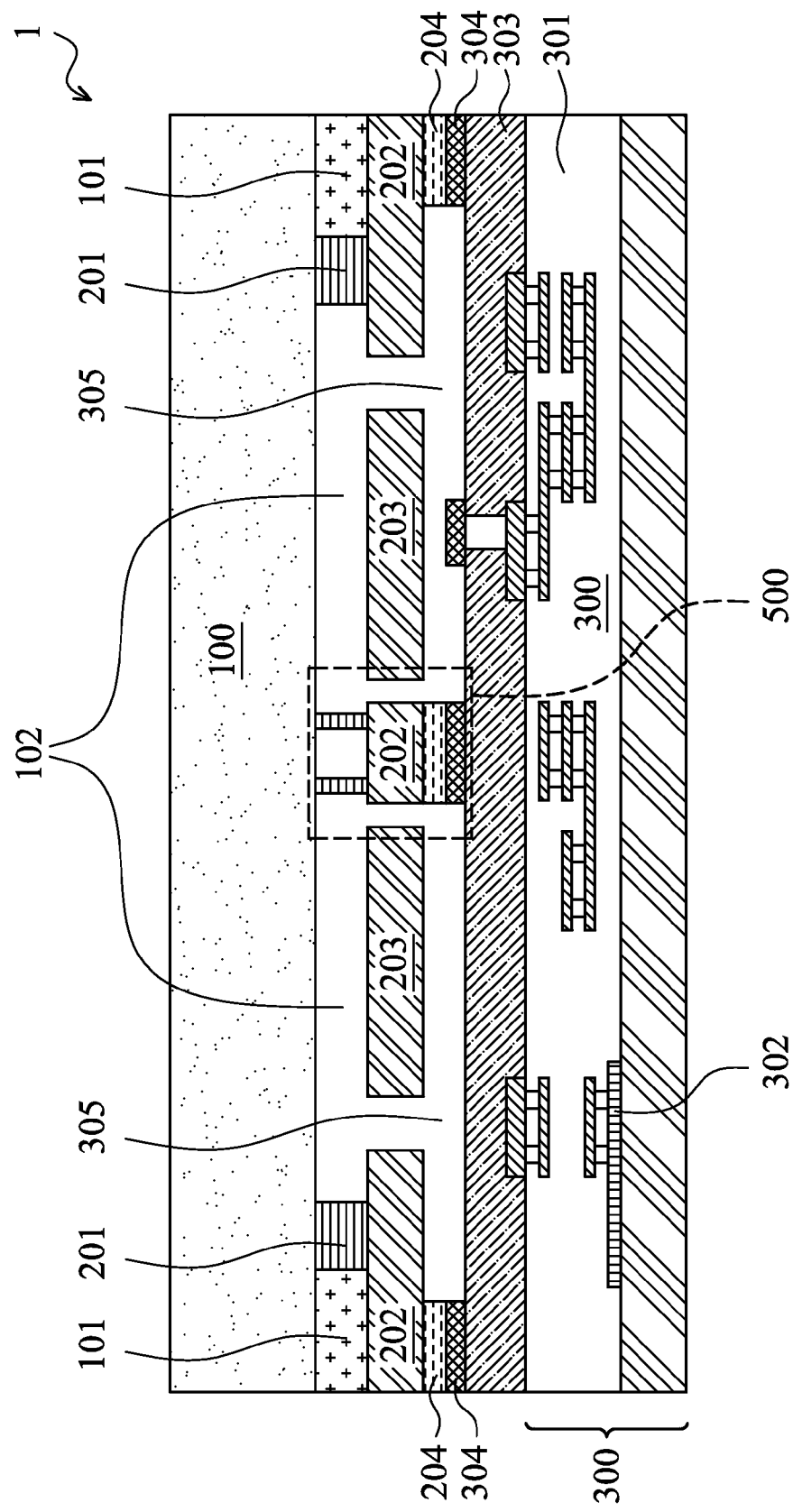

In FIG. 1i, the structure comprising wafers 100 and 200 is bonded to the wafer 300 structure. The two structures may be bonded together by eutectic bonding between the bonding material 204 (on wafer 200) and bonding material 304 (on wafer 300). The eutectic bonding process may form a hermetic seal and electrical connection between the two structures allowing the movable element 203 and the static elements 202 to form electrical connections to external components, for example, through the contact pads 403 and TSV 400 on wafer 300 (see FIG. 1k). A bond force of larger than 35 kN and a temperature of larger than 400° C. can be applied to get a good bond strength. In an embodiment, a vacuum chamber may be used as a bonding chamber. However, in another embodiment, the bond chamber has atmospheric pressure.

The resulting structure, as illustrated in FIG. 1i, shows a MEMS structure comprising a movable element 203 and static elements 202 with an upper cavity 102 above and a lower cavity 305 below. The upper cavity 102 is formed by the removal of portions of the dielectric layer 101 and the cavity below is formed by the bonding materials 204 and 304. The pressure level of the cavities may be controlled by the bonding process. In an embodiment, the cavities 102 and 305 are at a vacuum as a result of being bonded in a vacuum chamber. The upper and lower cavities 102 and 305 adjoin in the spaces between the static elements 202 and the movable element 203. The upper cavity 102 and the lower cavity 305 form a single cavity surrounding the movable element 203. The supporting post 500 comprises center portions of bonding materials 204 and 304, a center static element 202, a center portion of dielectric layer 101, and center portions of the protective component 201. The supporting post 500 is in the cavity comprising the upper cavity 102 and the lower cavity 305.

Figure 1J:
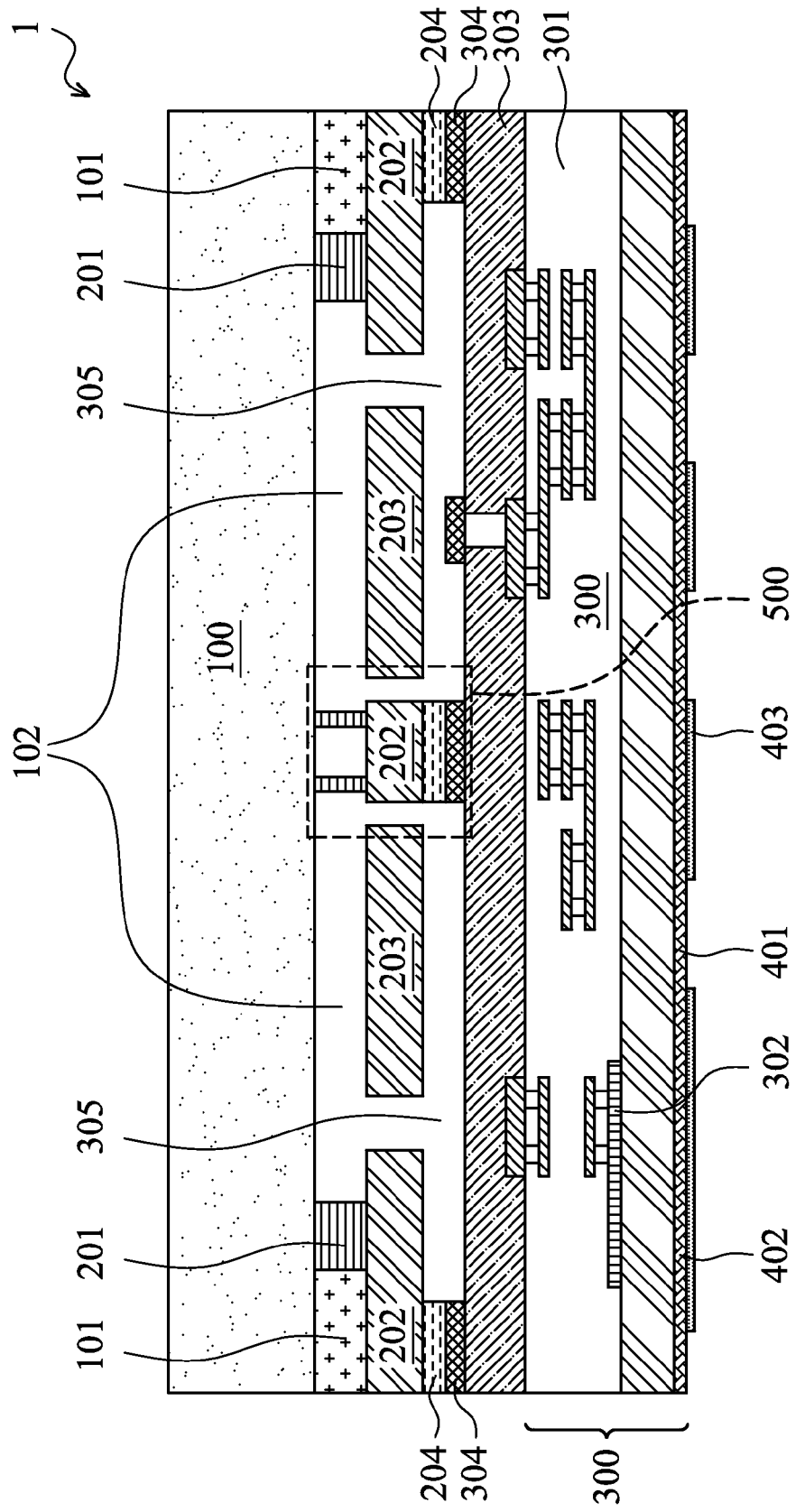

FIG. 1j illustrates the thinning of the wafers 100 and 300 after the bonding process. The thinning process may include grinding and CMP processes, etch back processes, or other acceptable processes. Wafer 300 may be thinned to reduce the amount of processing time for the subsequent TSV formation process. Further, wafers 100 and 300 may be thinned to reduce the overall package size of the MEMS device 1. In an embodiment the wafer 100 may be thinned to a thickness between about 300 µm and 100 µm and the wafer 300 may be thinned to a thickness less than 100 µm, such as 80 µm.

The thinning of wafer 300 and wafer 100 may reduce the overall strength of the MEMS device 1. The inventors discovered that the formation of the supporting post 500 may reduce the deformation of wafer 300 that may be caused by the pressure difference between the cavities and the external area, the process strain, and external force. The supporting post 500 may reduce the strain impact on wafer 300 by up to 80%. The supporting post 500 may also provide additional points for the movable element 203 to be anchored to the static elements 202 by hinges, springs, beams, or the like. In an embodiment, the movable element 203 may be anchored to only the outer static elements 202. In another embodiment, the movable element may be anchored only to the center static element 202 of the supporting post 500. In yet another embodiment, the movable element 203 may be anchored to both the outer static elements 202 and the center static element 202. This configuration flexibility may also allow flexibility in the layout of the active and passive devices and interconnects in the interconnect structure 301 and wafer 300.

Figure 1K:
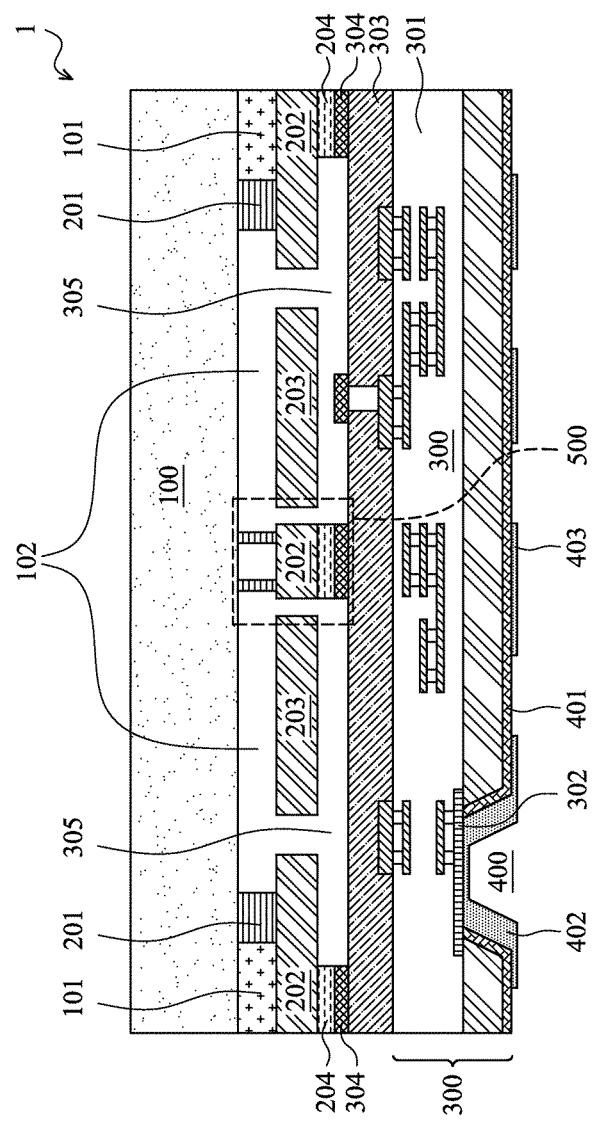

In FIG. 1k, the TSV 400 and contact pads 403 are formed on the backside of wafer 300. The TSV 400 extends from a backside surface of wafer 300 to the contact pad 302 which is on the top surface of wafer 300. The contact pads 403 may be coupled, directly or indirectly, to metal interconnects in the interconnect structure 301. TSV 400 may be formed by forming a recess in the wafer 300 by, for example, etching, milling, laser techniques, the like, or a combination thereof. A thin barrier layer 401 may be conformally deposited over the back side of the wafer 300 and in the recess, such as by CVD, atomic layer deposition (ALD), PVD, thermal oxidation, the like, or a combination thereof. The barrier layer 401 may comprise a nitride or an oxynitride, such as titanium nitride, titanium oxynitride, tantalum nitride, tantalum oxynitride, tungsten nitride, the like, or a combination thereof. A conductive material may be deposited over the thin barrier layer and in the recess. The conductive material may be formed by an electro-chemical plating process, CVD, ALD, PVD, the like, or a combination thereof. Examples of conductive materials are copper, tungsten, aluminum, silver, gold, combinations of these, such as alloys, or the like. The conductive material may be patterned to form the contact pads 403 and the TSV conductive material 402.

Figure 2:
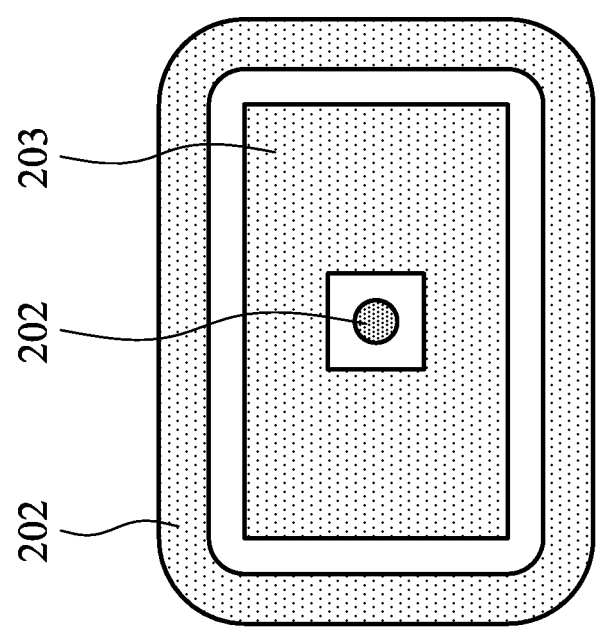
FIG. 2 illustrates in plan view an illustrative embodiment of the same MEMS device.

FIG. 2 illustrates a plan view of the static elements 202, the movable element 203, and the center static element 202 of the supporting post 500. As shown in FIG. 2, the outer static element 202 encircles the movable element 203 with a space between the movable element 203 and the outer static element 202. Similarly, the movable element 203 encircles the center static element 202 of the supporting post 500. As discussed above, the movable element 203 may be supported by hinges, springs, beams, or the like (not shown) which extend from the static elements 202.

Although the present embodiment is described in relation to a motion sensor, other types of MEMS devices are also within the contemplated scope of this disclosure. For example, a device structure including a supporting post could be applied to an accelerometer device or a gyroscope device. Further, the device structure could be applied to any MEMS device structure having a low pressure cavity or a thin capping wafer.

FIGS. 3a through 3e illustrate a method of forming another embodiment of a MEMS device 1. Details regarding this embodiment that are similar to those for the previously described embodiment will not be repeated herein. In this embodiment, the wafer 200 and wafer 300 are formed together and then bonded to wafer 100 to form the cavities surrounding the movable element 203. The upper cavity 102 is formed by recessing the wafer 100 and the lower cavity 305 is formed by removing portions of the dielectric layer 303.

Figure 3A:
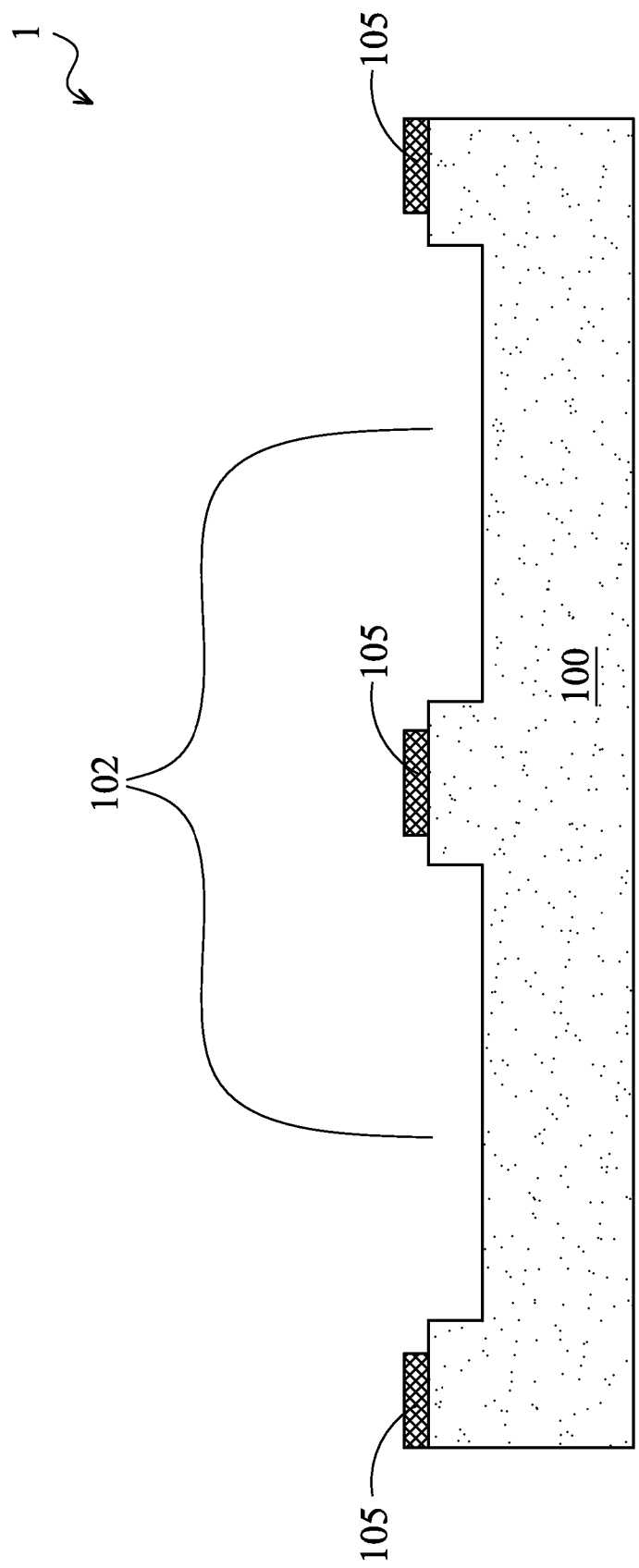

FIG. 3a illustrates a wafer 100 at an intermediate stage of processing. In FIG. 3a, the recessing of wafer 100 and the forming and patterning of bonding material 105 is illustrated. The wafer 100 may be recessed to form the upper cavity 102. The recesses may be formed by etching, milling, or other acceptable processes as discussed above. In an alternative embodiment, the recesses could be formed by epitaxially growing the raised portions of the wafer 100 from a top surface the wafer 100 within trenches or openings formed in a patterned layer atop wafer 100. The bonding material is formed and patterned on wafer 100 similar to bonding material 204 in FIG. 1e.

In FIG. 3b, the processing of a wafer 300 is at an intermediate stage of processing in which the interconnect structure 301 is formed atop the wafer 300, as has been previously described. In an embodiment, the dielectric layer 303 may be formed, as has been previously described, and patterned to form openings in dielectric layer 303 using acceptable lithography techniques.

In FIG. 3c, a protective component 201 is deposited in the openings in the dielectric layer 303 and a wafer 200 is placed atop the dielectric layer 303 and the protective component 201. The wafer 200 is patterned to form a movable element 203, static elements 202, and lower cavity 305. The wafer 200 may comprise similar materials as described in the previous embodiment. In an alternative embodiment, the cavity 305 may be formed by depositing or epitaxially growing wafer 200 on the dielectric layer 303, patterning the wafer 200, and selectively etching portions of the dielectric layer 303 as has been previously described.

FIG. 3d illustrates the formation of vias 205 and the forming and patterning of bonding material 204. The vias 205 are formed through the static elements 202 and the dielectric layer 303 to a metal interconnect on a top surface of the interconnect structure 301. The vias 205 may provide for electrical and physical connection between the wafer 200 and the interconnect structure 301 which may allow for connections to external devices through the contact pads 403 and the TSV 400 (see FIG. 3f). The vias 205 may be formed by similar processes and materials as has been previously described. The bonding material 204 is formed and patterned on the wafer 200. The bonding material 204 may be formed and patterned by similar processes and materials as has been previously described.

In FIG. 3e, the lower cavity 305 is formed by the removal of a portion of the dielectric layer 303. The resulting structure is a MEMS device 1 having a movable element 203 formed over a lower cavity 305 to allow for free movement in at least one axis as has been previously described. Details regarding the etching process are similar to those previously described, and the details are not repeated herein.

Figure 3F:
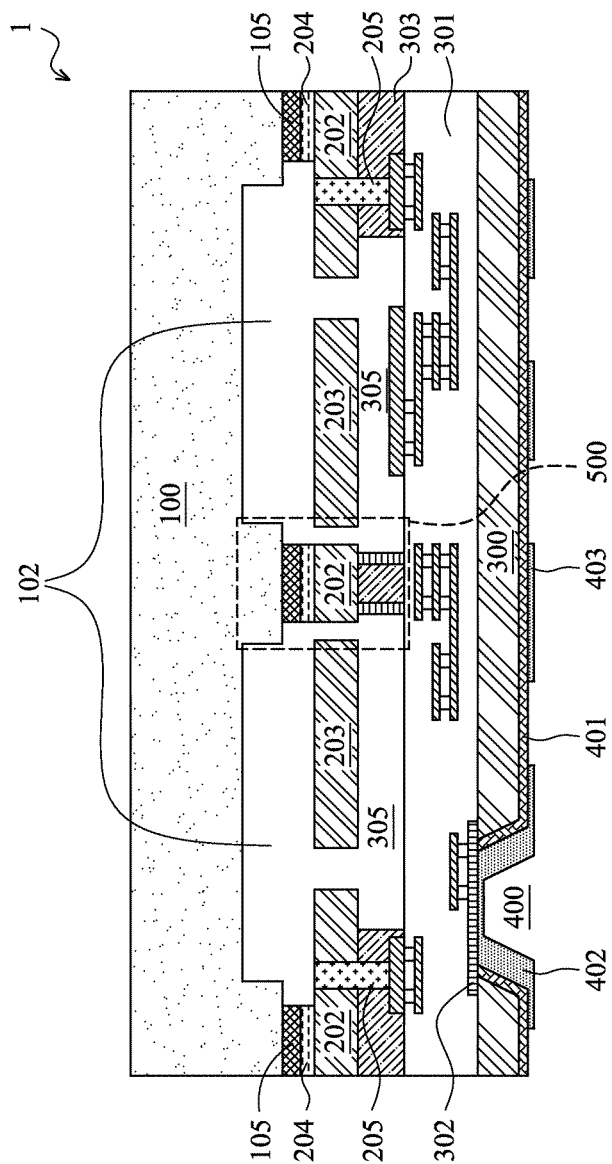

In FIG. 3f, the structure comprising wafers 200 and 300 is bonded to wafer 100 forming the supporting post 500. The bonding process between bonding material 105 and bonding material 204 is similar to the process described in the previous embodiment. The supporting post 500 comprises a raised portion of wafer 100, center portions of bonding materials 105 and 204, a center static element 202, and a center portion of dielectric layer 303. After the bonding process, the wafer 100 and the wafer 300 may be thinned by methods as previously described. The barrier layer 401, TSV 400, TSV conductive material 402, and contact pads 403 may be formed as previously described to enable connections to external devices.

As shown in FIG. 3f, the upper and lower cavities 102 and 305 are adjoined in the spaces between the static elements 202 and the movable element 203. The upper and lower cavities 102 and 305 form a single cavity surrounding the movable element 203 and the supporting post 500.

Figure 4:
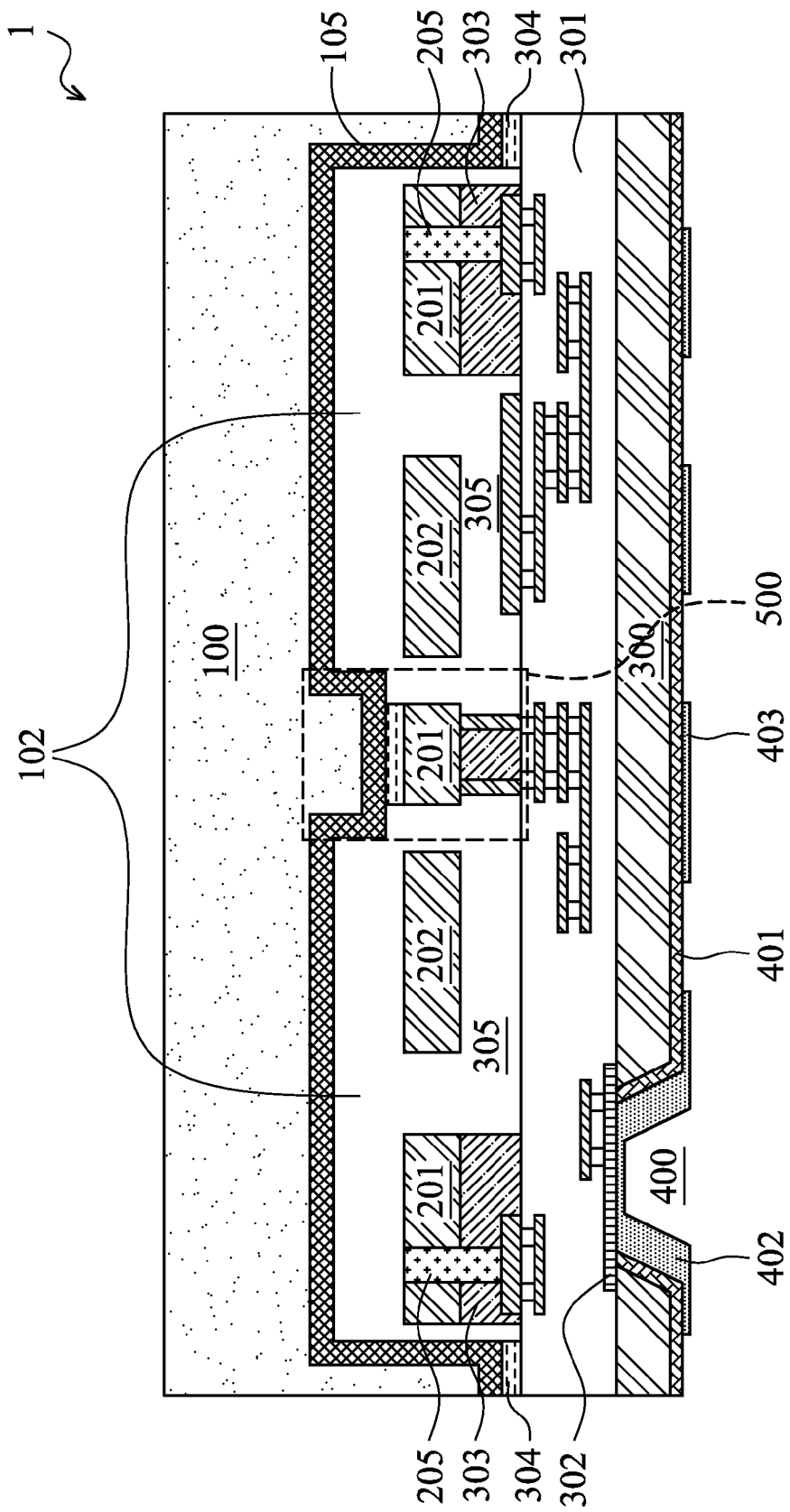
FIG. 4 illustrates a third embodiment of a MEMS device.

FIG. 4 illustrates yet another embodiment of MEMS device 1. In this embodiment, the bonding process is between the wafer 100 and the wafer 300. The wafer 200 is formed on the dielectric layer 303 which is formed on the interconnect structure 301 of wafer 300. The wafer 200 and the dielectric layer 303 are patterned to remove them from the edges of wafer 300 to allow the direct connection between wafer 100 and wafer 300. Details regarding this embodiment that are similar to those for the previously described embodiment will not be repeated herein.

Figure 5:
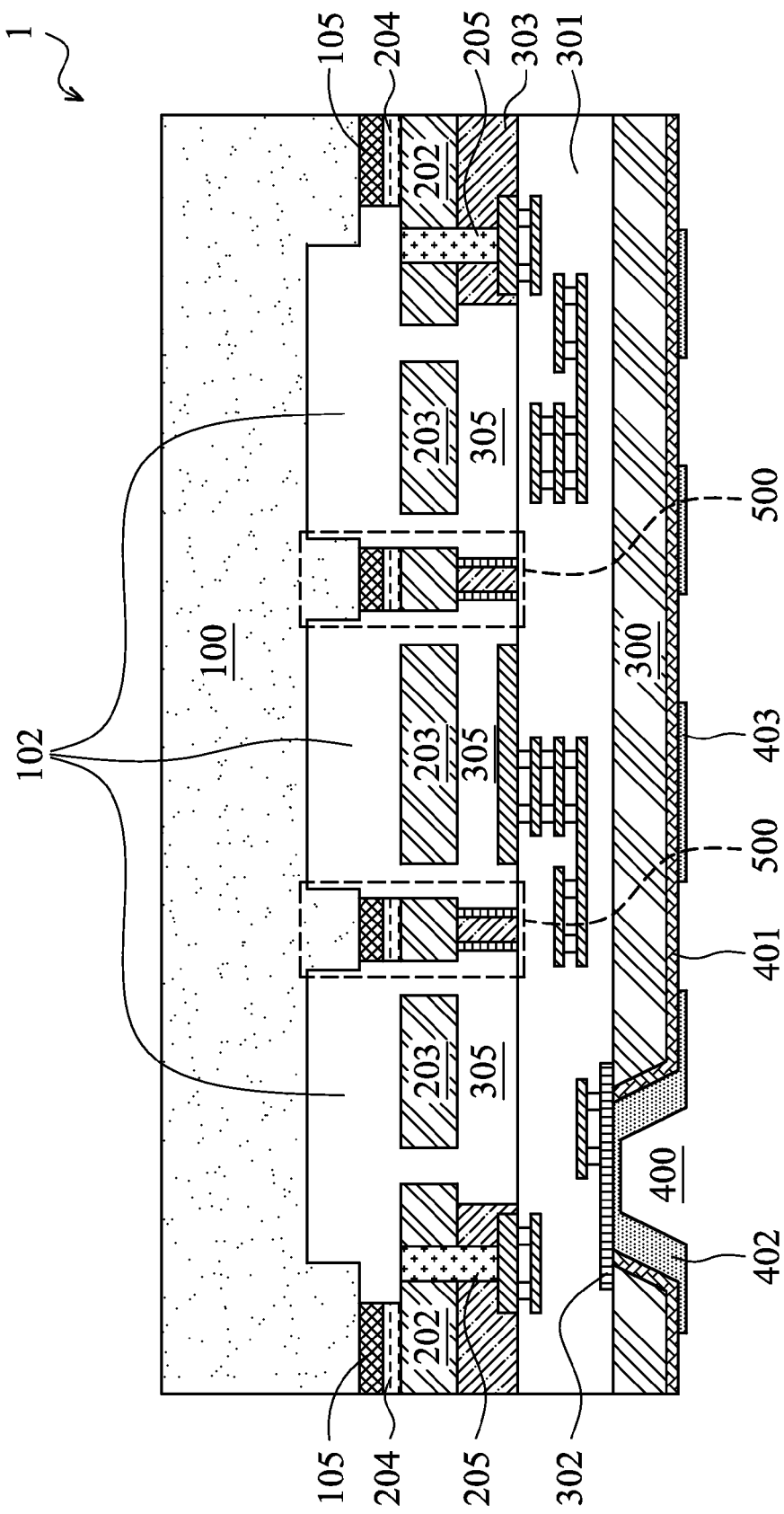
FIG. 5 illustrates a fourth embodiment of a MEMS device.

FIG. 5 illustrates another embodiment of MEMS device 1. In this embodiment, the device includes multiple supporting posts 500. The supporting posts 500 are laterally adjacent to each other. The upper cavity 102 and the lower cavity 305 form a single cavity surrounding the movable element 203 and the supporting posts 500. Details regarding this embodiment that are similar to those for the previously described embodiment will not be repeated herein.

Figure 6B:
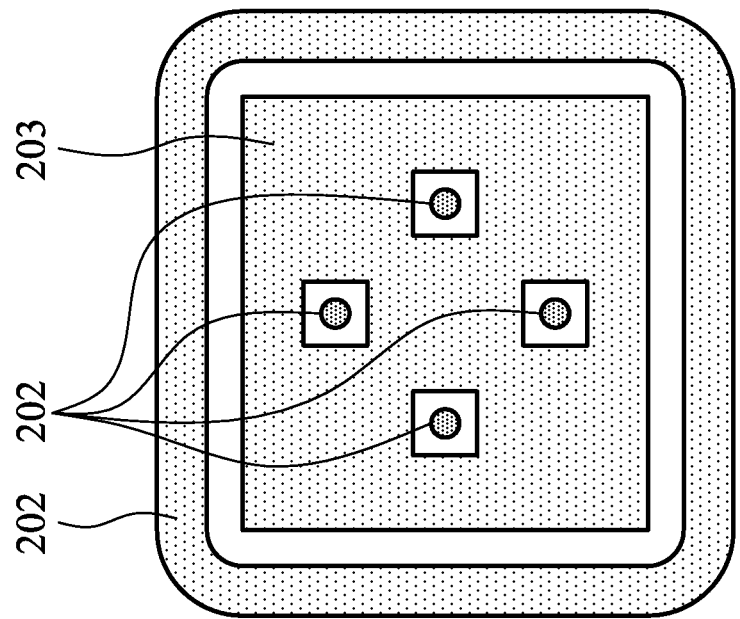
FIGS. 6a and 6b illustrate in plan views illustrative embodiments of the MEMS device in FIG. 5.
Figure 6A:
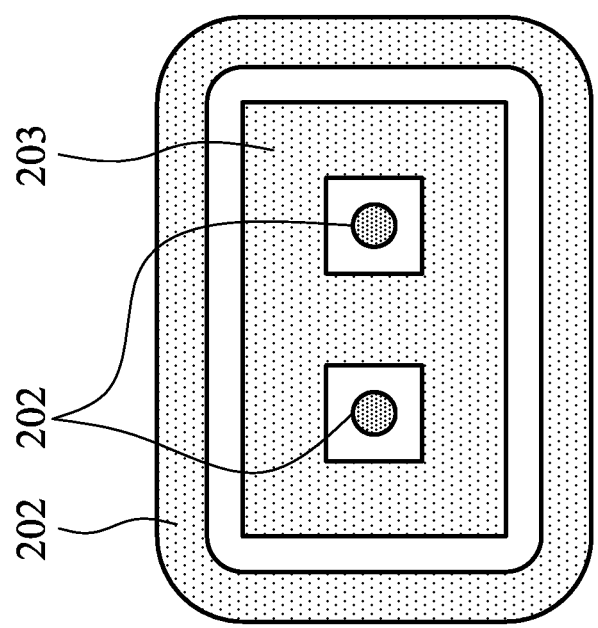

FIG. 6a illustrates a plan view of the static elements 202, the movable element 203, and center static element 202 of the supporting post 500 of the embodiment illustrated in 5. As shown in FIG. 6a, the movable element has been patterned to allow two supporting posts 500 to be formed between the wafer 100 and the wafer 300 (see FIG. 5). As discussed above, the movable element 203 may be supported by hinges, springs, beams, or the like (not shown) which extend from the static elements 202. In an embodiment, the movable element may only be supported from the outer static element 202.

FIG. 6b illustrates another plan view of the static elements 202, the movable element 203, and center static element 202 of the supporting post 500 of the embodiment illustrated in 5. As shown in FIG. 6b, the movable element has been patterned to allow four supporting posts 500 to be formed between the wafer 100 and the wafer 300 (see FIG. 5). As discussed above, the movable element 203 may be supported by hinges, springs, beams, or the like (not shown) which extend from the static elements 202. In an embodiment, the movable element may only be supported from the outer static element 202. Although the present embodiments have been described in relation to a MEMS device one, two, or four supporting posts, other configurations of supporting posts are also within the contemplated scope of this disclosure.

An embodiment is a method for forming a microelectromechanical system (MEMS) device comprising forming a MEMS structure over a first substrate, wherein the MEMS structure comprises a movable element and an adjacent static element; forming a cavity surrounding the movable element; forming an interconnect structure on a second substrate; depositing a first dielectric layer on the interconnect structure; and bonding the MEMS structure to the first dielectric layer, wherein the static element forms a first supporting post in the cavity, the first supporting post configured to support the second substrate.

Another embodiment is a method of forming a MEMS device comprising forming an interconnect structure on a first substrate; depositing a dielectric layer on the interconnect structure; patterning the dielectric layer to form a central portion and two outer portions; bonding or depositing a MEMS wafer to the patterned dielectric layer; patterning the MEMS wafer to form a movable element, a central static element, and an outer static element, the movable element encircling the central static element, and the outer static element encircling the movable element; and depositing a first bonding material on the central static element and the outer static element. The method further comprising forming two recesses in a second substrate, wherein the recesses form a central raised portion of the second substrate and two outer raised portions of the second substrate; depositing a second bonding material on the central raised portion and the outer raised portions of the second substrate; and bonding the MEMS wafer to the second substrate, wherein the central portion of the dielectric layer, the central static element, the first bonding material on the central static element, the second bonding material on the central raised portion, and the central raised portion form a first supporting post.

A further embodiment is a MEMS device comprising a MEMS structure above a first substrate, wherein the MEMS structure comprises a movable element, a central static element, and an outer static element, wherein the movable element is suspended above the first substrate, the movable element is laterally separated from the outer static element by a first spacing, and the movable element is laterally separated from the central static element by a second spacing; and a central portion of a bonding material between the first substrate and a bottom surface of the central static element. The device further comprising a second substrate above the MEMS structure; a central portion of a first dielectric layer between the second substrate and a top surface of the central static element; and a supporting post, the supporting post comprising the central portion of the bonding material, the central static element, and the central portion of the first dielectric layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a microelectromechanical system (MEMS) device comprising:
    forming a MEMS structure over a first substrate, wherein the MEMS structure comprises a movable element and a static element;
    forming an interconnect structure on a second substrate;
    before the forming the interconnect structure, forming a contact pad on a top surface of the second substrate;
    depositing a first dielectric layer on the interconnect structure; and
    bonding the MEMS structure to the first dielectric layer, the bonding forming a cavity surrounding the movable element, the static element forming at least part of a first supporting post in the cavity, the first supporting post configured to support the second substrate;
    thinning a backside of the second substrate;
    forming an opening in the backside of the second substrate, wherein a bottom surface of the opening adjoins the contact pad;
    depositing a conductive material on the backside of the second substrate and in the opening; and
    patterning the conductive material to form a via in the opening and contact pads on the backside of the second substrate.

2. The method of claim 1, wherein the bonding further forms a second supporting post in the cavity, wherein the second supporting post is laterally spaced from the first supporting post, the second supporting post configured to support the second substrate.

3. The method of claim 1, wherein the movable element is not supported by the first supporting post.

4. The method of claim 1, wherein the bonding further comprises:
    depositing a first bonding material on the MEMS structure;
    depositing a second bonding material on the first dielectric layer;
    bringing the first bonding material and the second bonding material into contact;
    creating a hermetic seal and electrical connection between the first bonding material and the second bonding material; and
    creating a vacuum in the cavity.

5. The method of claim 4, wherein the first supporting post comprises:
    a portion of the first bonding material;
    a portion of the second bonding material; and
    the static element of the MEMS structure.

6. The method of claim 1 further comprising:
    the forming the MEMS structure further comprises:
    depositing a second dielectric layer on the first substrate;
    forming openings in the second dielectric layer;
    depositing a protective component in the openings;
    bonding a MEMS wafer to the second dielectric layer;
    patterning the MEMS wafer to form the movable element, wherein the movable element encircles a central static element, and the movable element is encircled by an outer static element; and
    the forming the cavity further comprises:
    removing portions of the second dielectric layer between the movable element and the first substrate, wherein the removed portions of the second dielectric layer are not protected by the protective component, and the removing forms a central portion of the second dielectric layer between the first substrate and the central static element.

7. The method of claim 6, wherein the central portion of the second dielectric layer is between two protective components.

8. The method of claim 1, wherein the forming the cavity further comprises:
    recessing the first substrate; and
    removing portions of the first dielectric layer.

9. The method of claim 1, wherein the movable element is supported by the first supporting post.

10. A method for forming a microelectromechanical system (MEMS) device comprising:
    forming a MEMS structure over a first substrate, the MEMS structure comprising a movable element and a static element, the forming the MEMS structure comprising:
    the forming the MEMS structure further comprises:
    depositing a first dielectric layer on the first substrate;
    forming openings in the first dielectric layer;
    depositing a protective component in the openings;
    bonding a MEMS wafer to the first dielectric layer; and
    patterning the MEMS wafer to form the movable element, the movable element encircling a central static element, and the movable element being encircled by an outer static element;
    forming an interconnect structure on a second substrate;
    depositing a second dielectric layer on the interconnect structure; and
    bonding the MEMS structure to the second dielectric layer, the bonding forming a cavity surrounding the movable element, the static element forming at least a portion of a first supporting post in the cavity.

11. The method of claim 10, wherein the bonding further forms a second supporting post in the cavity, wherein the second supporting post is laterally spaced from the first supporting post.

12. The method of claim 10 further comprising:
before the forming the interconnect structure, forming a contact pad on a top surface of the second substrate;
thinning a backside of the second substrate;
forming an opening in the backside of the second substrate, wherein a bottom surface of the opening adjoins the contact pad;
depositing a conductive material on the backside of the second substrate and in the opening; and
patterning the conductive material to form a via in the opening and contact pads on the backside of the second substrate.

13. The method of claim 10, wherein the bonding further comprises:
depositing a first bonding material on the MEMS structure;
depositing a second bonding material on the second dielectric layer;
bringing the first bonding material and the second bonding material into contact;
creating a hermetic seal and electrical connection between the first bonding material and the second bonding material; and
creating a vacuum in the cavity.

14. The method of claim 13, wherein the first supporting post further comprises:
a portion of the first bonding material;
a portion of the second bonding material; and
the static element of the MEMS structure.

15. A MEMS device comprising:
a MEMS structure above a first substrate, the MEMS structure comprising a movable element, a central static element, and an outer static element, the movable element being suspended above the first substrate, the movable element being laterally separated from the outer static element by a first spacing, and the movable element being laterally separated from the central static element by a second spacing;
a central portion of a bonding material between the first substrate and a bottom surface of the central static element;
a second substrate above the MEMS structure;
a central portion of a first dielectric layer between the second substrate and a top surface of the central static element; and
a supporting post, the supporting post comprising:
the central portion of the bonding material, the central static element, and the central portion of the first dielectric layer, wherein the movable element encircles the central static element and the outer static element encircles the movable element.

16. The MEMS device of claim 15 further comprising:
a first outer portion of the first dielectric layer, the first outer portion between the outer static element and the second substrate;
a second outer portion of the first dielectric layer, the second outer portion between the outer static element and the second substrate;
a first outer portion of a protective component, the first outer portion of the protective component between the outer static element and the second substrate, and the first outer portion of the protective component adjacent the first outer portion of the first dielectric layer;
a second outer portion of the protective component, the second outer portion of the protective component between the outer static element and the second substrate, and the second outer portion of the protective component adjacent the second outer portion of the first dielectric layer; and
a first inner portion and a second inner portion of the protective component, the first and second inner portions of the protective components adjoining opposite sides of the central portion of the first dielectric layer.

17. The MEMS device of claim 16 further comprising:
an upper portion of a cavity, the upper portion above the movable element; and
a lower portion of the cavity, the lower portion below the movable element, wherein the lower portion adjoins the upper portion in the first spacing and the second spacing.

18. The MEMS device of claim 15, wherein the movable element is not supported by the supporting post.

19. The MEMS device of claim 15 further comprising:
an interconnect structure on a top surface of the first substrate;
a second dielectric layer on the interconnect structure, the second dielectric layer between the interconnect structure and the central portion of the bonding material; and
a through substrate via (TSV) in the first substrate, the TSV electrically coupled to a metal feature in the interconnect structure.

20. The MEMS device of claim 15, wherein the supporting post further comprises a raised portion of the second substrate, the raised portion above the central portion of the first dielectric layer.

21. The MEMS device of claim 15 further comprising:
a second supporting post laterally spaced from the supporting post.

* * * * *